United States Patent [19]

Okuyama et al.

[11] Patent Number: 5,285,459
[45] Date of Patent: Feb. 8, 1994

[54] HDB3 CODE VIOLATION DETECTOR

[75] Inventors: Yuzo Okuyama; Kazuo Sato; Yamato Tachibana, all of Yokohama; Ryuhei Motono, Sapporo; Kazuo Takeoka, Yokohama, all of Japan

[73] Assignee: Fujitsu Limited, Kawasaki, Japan

[21] Appl. No.: 755,761

[22] Filed: Sep. 6, 1991

[30] Foreign Application Priority Data

Sep. 7, 1990 [JP] Japan .................. 2-237887

[51] Int. Cl.⁵ ............... G06F 11/00; H03M 5/06; H03M 13/00
[52] U.S. Cl. .................. 371/57.1; 341/68; 341/94
[58] Field of Search ......... 371/57.2, 57.1; 370/70, 370/78, 100.1; 341/68, 94, 73

[56]  References Cited

U.S. PATENT DOCUMENTS

| | | | |
|---|---|---|---|
| 4,520,480 | 5/1985 | Kawai | 370/100 |
| 4,545,055 | 10/1985 | Patel | 371/55 |
| 4,658,399 | 4/1987 | D'Angio et al. | 371/5 |
| 4,701,912 | 10/1987 | Bueno et al. | 370/94 |
| 4,747,096 | 5/1988 | Piasechi et al. | 370/81 |

FOREIGN PATENT DOCUMENTS

| | | | |
|---|---|---|---|
| 0344751 | 12/1989 | European Pat. Off. . | |
| 57-44351 | 6/1982 | Japan . | |
| 1-321732 | 3/1990 | Japan . | |
| 3-107246 | 5/1991 | Japan | H04L25 49 |
| 3-195152 | 8/1991 | Japan | H04L25 49 |
| 2144948 | 3/1985 | United Kingdom | H03M7 14 |

OTHER PUBLICATIONS

Wysochi, Tadeusz Jr., "Spectral Analysis of the 3T4B Coded Signal" Inst. of Telecomm., 1988, pp. 625–628.
Tanik et al., "Modification of a Radio Link System From Analog to Digital", ISCAS 1988 pp. 1337–1339.
Wray et al, "Chip Set Simplifies Linking T1 or /SDN Lines to PBXs" Electronic Design, Aug. 20, 1987 pp. 111–115.
"General Aspects of Digital Transmission Systems; Terminal Equipments", IXth Plenary Assembly, Nov. 1988.

Primary Examiner—Robert W. Beausoliel, Jr.
Assistant Examiner—Joseph E. Palys
Attorney, Agent, or Firm—Staas & Halsey

[57] ABSTRACT

An HDB3 code violation detector includes a converting part for receiving positive polarity data and negative polarity data from a PCM line and for converting an HDB3 code received via the PCM line into an NRZ signal, and a first judging part receiving the positive polarity data, the negative polarity data and the NRZ signal, for judging whether or not a pattern of the NRZ signal received from the converting part is possible when the NRZ signal is NRZ "1" and for outputting a judgement result. In addition, the detector includes a second judging part receiving the positive polarity data, the negative polarity data and the NRZ signal, for judging whether or not a pattern of the NRZ signal received from the converting part is possible when the NRZ signal has a maximum of three consecutive NRZ "0"s and for outputting a judgement result. Further, the detector includes a third judging part receiving the positive polarity data, the negative polarity data and the NRZ signal, for judging whether or not a pattern of the NRZ signal received from the converting part is possible when the NRZ signal has at least four consecutive NRZ "0"s and for outputting a judgement result, and a detecting part for detecting a code violation of the HDB3 code based on the judgement results of the first, second and third judging parts.

16 Claims, 10 Drawing Sheets

FIG. 8

| HDB3 | | $a_1$ | $a_2$ | $a_3$ | $a_4$ |
|---|---|---|---|---|---|
| | P | +B 0 | 0 +B | V 0 | 0 +B |
| | N | 0 -B | -B 0 | 0 -B | V 0 |

FIG. 9

| HDB3 | | $b_1$ | $b_2$ | $b_3$ |
|---|---|---|---|---|
| | P | 0 | 0 0 | 0 0 0 |
| | N | 0 | 0 0 | 0 0 0 |

FIG. 10

| | | PREVIOUS "V" | IMMEDIATELY PRECEDING "B" | IN CASE OF 4 NRZ "0"s | | |
|---|---|---|---|---|---|---|
| | | | | 1ST BIT | 2ND~4TH BIT | |
| HDB3 | P | 0 | +B | 0 | 0 0 V | $C_1$ |
| HDB3 | N | V | 0 | 0 | 0 0 0 | |
| HDB3 | P | V | 0 | 0 | 0 0 0 | $C_2$ |
| HDB3 | N | 0 | −B | 0 | 0 0 V | |
| HDB3 | P | 0 | 0 | +B | 0 0 V | $C_3$ |
| HDB3 | N | V | −B | 0 | 0 0 0 | |
| HDB3 | P | V | +B | 0 | 0 0 0 | $C_4$ |
| HDB3 | N | 0 | 0 | −B | 0 0 V | |
| HDB3 | P | V | — | 0 | 0 0 V | $C_5$ |
| HDB3 | N | 0 | — | −B | 0 0 0 | |
| HDB3 | P | 0 | — | +B | 0 0 0 | $C_6$ |
| HDB3 | N | V | — | 0 | 0 0 0 | |

HDB3 CODE VIOLATION DETECTOR

BACKGROUND OF THE INVENTION

The present invention generally relates to HDB3 code violation detectors, and more particularly to an HDB3 code violation detector which detects a code violation when demodulating a digital transmission HDB3 code into a non-return-to-zero (NRZ) code by collating the HDB3 code with respect to the demodulated NRZ code for the purpose of checking the quality of the digital line.

Generally, when systems are coupled via a PCM (Pulse Code Modulation) digital line, the HDB3 code which is a digital transmission code in conformance with the CEPT (European Conference of Postal and Telecommunication Administrations); system PCM 30 of the CCITT (International Telegraph and Telephone Consultative Committee) Recommendations G.732 is used.

The data transmitted and received between the systems is formatted, and each system reads a deterioration in the data format when the received digital transmission code is demodulated in the NRZ code, so as to detect the quality of the digital line.

In the recent CCITT Recommendations G.821, the detection as a code violation of the digital transmission code is also recommended as an important item in monitoring the quality of the digital line.

In order to add the new function of detecting the HDB3 code violation to the system which is in conformance with the CEPT system PCM 30 of the conventional CCITT Recommendations G.732, it is necessary to realize a circuit which is of a minimum scale or size and is capable of detecting the code violation with high accuracy.

FIG. 1 is a diagram for explaining an example of a conventional HDB3 code violation detection system. The correspondence of the positive and negative pulses of the HDB3 code with respect to the NRZ signal is as shown in FIG. 1, and two kinds of checks C1 and C2 are made as shown.

The first check C1 checks a mark "B" and one immediately preceding bit. On the other hand, the second check C2 checks a violation pattern "B00V" or "100V" and the alteration or combination of the positive and negative pulses, where "V" denotes a violation. In other words, the second check C2 makes a pattern check and an alternation check. In FIG. 1, the first check C1 is indicated by leftwardly descending hatchings, and the second check C2 is indicated by rightwardly descending hatchings.

However, the conventional system has the following four problems.

First, the first check C1 does not make an alternation check on the mark "B".

Second, the second check C2 does not make clear the normality of the mutual relationship between the pulse of the past mark "B" and the violation "V" of the violation pattern.

Third, no check is made for the case where no pulses are present.

Fourth, in the checks C1 and C2, no check is made as to the opposite polarity of the violation pattern and the pulse of the mark "B" or the violation "V".

SUMMARY OF THE INVENTION

Accordingly, it is a general object of the present invention to provide a novel and useful HDB3 code violation detector in which the problems described above are eliminated.

Another and more specific, object of the present invention is to provide an HDB3 code violation detector including converting means for receiving positive polarity data and negative polarity data from a PCM line and for converting an HDB3 code received via the PCM line into an NRZ signal. In addition, the invention includes first judging means, coupled to the converting means and receiving the positive polarity data, the negative polarity data and the NRZ signal, for judging or determining whether or not a pattern of the NRZ signal received from the converting means is possible when the NRZ is NRZ "1"and for outputting a judgement result. The invention also includes a second judging means, coupled to the converting means and receiving the positive polarity data, the negative polarity data and the NRZ signal, for judging or determining whether or not a pattern of the NRZ signal received from the converting means is possible when the NRZ signal has a maximum of three consecutive NRZ "0"s and for outputting a judgement result. Further, a third judging means, is provided coupled to the converting means and receiving the positive polarity data, the negative polarity data and the NRZ signal, for judging or determining whether or not a pattern of the NRZ signal received from the converting means is possible when the NRZ signal has at least four consecutive NRZ "0"s and for outputting a judgement result. The invention further includes detecting means, coupled to the first, second and third judging means, for detecting a code violation of the HDB3 code based on the judgement results or determination of the first, second and third judging means. According to the HDB3 code violation detector of the present invention, the positive and negative polarities of the bipolar signal are simultaneously monitored while referring to the history of the patterns of the AMI (Alternate Mark Inversion) code. For this reason, it is possible to accurately detect the code violation using a circuit being of a relatively small scale.

Other objects and further features of the present invention will be apparent from the following detailed description when read in conjunction with the accompanying drawings.

BRIEF DESCRIPTION OF THE DRAWINGS

FIG. 8 is a diagram for explaining a check pattern for NRZ "1";

FIG. 9 is a diagram for explaining a check pattern for NRZ "0";

FIG. 10 is a diagram for explaining a check pattern for four NRZ "0"; and

DESCRIPTION OF THE PREFERRED EMBODIMENTS

Figure 1:
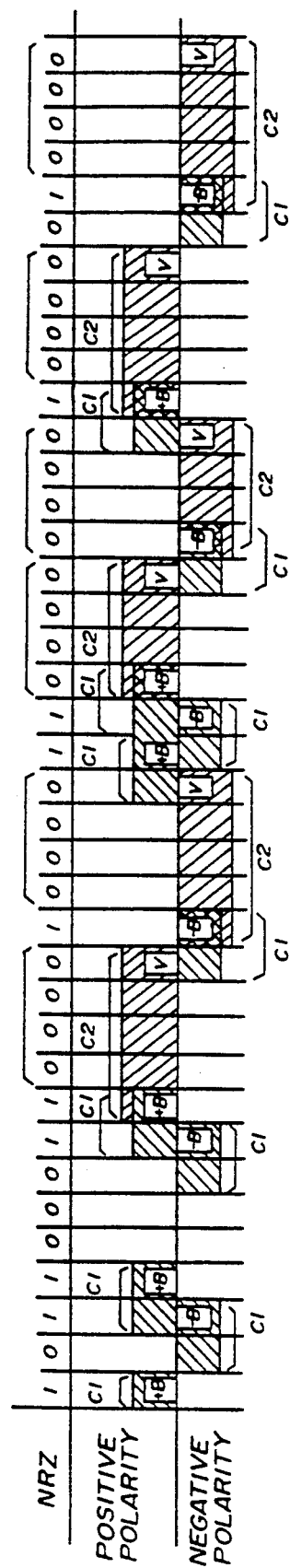
FIG. 1 is a diagram for explaining an example of a conventional HDB3 code violation detection system.
Figure 2:
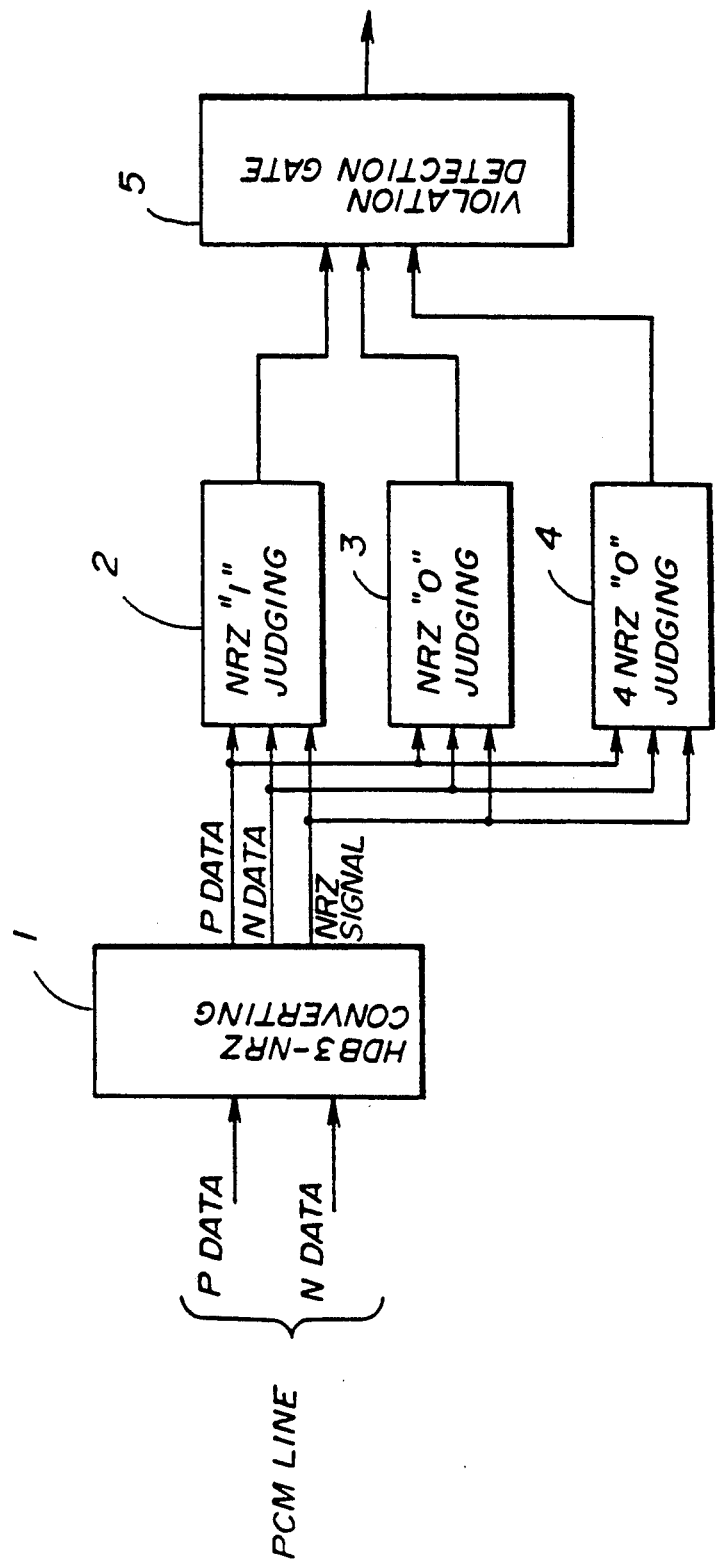
FIG. 2, is a system block diagram for explaining an operating principle of an HDB3 code violation detector according to the invention.

First, a description will be given of an operating principle of an HDB3 code violation detector according to the present invention, by referring to FIG. 2. The HDB3 code violation detector shown in FIG. 2 generally includes an HDB3-NRZ converting part 1, an NRZ "1"judging part 2, an NRZ "0"judging part 3, a four consecutive NRZ "0"judging part 4, and an HDB3 code violation detection gate part 5.

The HDB3-NRZ converting part 1 receives positive polarity data and negative polarity data (that is, positive and negative pulses) from a PCM line, and converts the HDB3 code which is transmitted from the PCM line into an NRZ signal.

The NRZ "1"judging part 2 receives the positive and negative polarity data and the NRZ signal output from the HDB3-NRZ or converting part 1, and judges or determines whether or not the data pattern received from the NRZ signal is possible when the incoming NRZ signal is NRZ "1".

The NRZ "0"judging part 3 receives the positive and negative polarity data and the NRZ signal output from the HDB3-NRZ converting part 1, and judges or determines whether or not the data pattern is possible when the incoming NRZ signal is a maximum of three consecutive NRZ "0".

The four consecutive NRZ "0"judging part 4 receives the positive and negative polarity data and the NRZ signal output from the HDB3-NRZ converting part 1, and judges whether or not the data pattern is possible when the incoming NRZ signal has at least four consecutive NRZ "0"s.

The HDB3 code violation detection gate part 5 detects a code violation of the HDB3 code based on the judgement results or determinations of the NRZ "1"judging part 2, the NRZ "0"judging part 3 and the four consecutive NRZ "0"judging part 4.

At the HDB3-NRZ converting part 1, the positive polarity data is latched by a positive data latch and the negative polarity data is latched by a negative data latch. In addition, a first selector selectively outputs the latched data from the positive data latch and the latched data from the negative data latch, and the data output from the first selector is successively input to a shift register.

On the other hand, a second selector selectively latches the latched data from the positive data latch and the latched data from the negative data latch as NRZ data having a polarity opposite to that output from the first selector. The NRZ data is input to a violation detection part wherein the violation is detected. When the violation detection part detects the violation, a HDB3 violation pattern mask part masks a violation pattern of the HDB3 code which is output from the shift register. As a result, an NRZ signal is output from the HDB3 violation pattern mask part.

The violation detecting part of the HDB3-NRZ converting part 1 is activated only when treating or connecting the HDB3 code.

Thereafter, the NRZ signal which is output from the HDB3-NRZ converting part 1 is input to the NRZ "1"judging part 2, the NRZ "0"judging part 3 and the four consecutive NRZ "0"judging part 4 together with the positive polarity data and the negative polarity data.

At the NRZ "1"judging part 2, a four consecutive NRZ "1"/NRZ "0"detecting part detects four consecutive NRZ "1"s or NRZ "0"s. Every time four consecutive NRZ "1"s or NRZ "0"s are detected by the four consecutive NRZ "1"/NRZ "0"detecting part, the positive polarity data is latched in a positive data latch and the negative polarity data is latched in a negative data latch. Thereafter, an alternation judging part judges or determines whether or not the polarity alternation or combination of the NRZ "1"s has a predetermined pattern, based on the latched data in the positive data latch and the latched data in the negative data latch. When it is detected that the NRZ signal has four consecutive NRZ "0"s, the judgement result of the alternation judging part is masked by an alternation judgement result masking part. An output of the alternation judgement result masking part becomes the judgement result of the NRZ "1"judging part 2.

At the NRZ "0"judging part 3, every time an NRZ "0"detecting part detects that the NRZ signal has an NRZ "0", the positive polarity data is latched in a positive data latch and the negative polarity data is latched in a negative data latch. Thereafter, an alternation judging part judges whether or not the polarity alternation of the NRZ "0"s has a predetermined pattern, based on the latched data in the positive data latch and the latched data in the negative data latch. When it is detected that the NRZ signal has four consecutive NRZ "0"s, the judgement result of the alternation judging part is masked by an alternation judgement result masking part. An output of the alternation judgement result masking part becomes the judgement result of the NRZ "0"judging part 3.

At the four consecutive NRZ (4NRZ) "0"judging part 4, a four consecutive NRZ "0"detecting part detects four consecutive NRZ "0"s, and a predetermined number of positive polarity data is consecutively latched in a positive data shift register and a predetermined number of negative polarity data is consecutively latched in a negative data shift register. Every time four consecutive NRZ "0"s are detected by the four consecutive NRZ "0"detecting part, the positive polarity data is latched in the positive data shift register and the negative polarity data is latched in the negative data shift register. Thereafter, a four consecutive positive polarity NRZ "0"judging part judges whether or not a predetermined pattern of the four consecutive positive polarity a NRZ "0"s is obtained, based on the latched data in the positive data latch, the positive polarity data of NRZ "1"immediately before the four consecutive NRZ "0"s from the positive data shift register and the positive polarity data of the first bit of the four consecutive NRZ "0"s. The four judges whether or not a predetermined pattern of the four consecutive negative polarity NRZ "0"s is obtained, based on the latched data from a negative data latch, the negative polarity data of NRZ "1"immediately before the four consecutive NRZ "0"s from the negative data shift register and the negative polarity data of the first bit of the four consecutive NRZ "0"s.

On the other hand, NRZ opposite polarity data judging part in the 4NRZ "0"judging part 4 receives the NRZ opposite polarity, data from the HDB3-NRZ converting part 1, and judges or determines whether or not the NRZ opposite polarity data has a predetermined pattern when four consecutive NRZ "0"s are obtained. Thereafter, a four consecutive NRZ "0"judging gate in the 4NRZ "0"judging part 4 judges whether or not the incoming NRZ signal has a pattern of four consecutive NRZ "0"s, based on the judgement results of the four consecutive positive polarity NRZ "0"judging part, the four consecutive negative polarity NRZ "0"judging part and the NRZ opposite polarity data judging part.

The four consecutive NRZ "0"judging part 4 is activated only when treating or having converted the HDB3 code into the NRZ signal The judgement results of the NRZ "1"judging part 2, the NRZ "0"judging part 3 and the four consecutive NRZ "0"judging part 4 are supplied to the HDB3 code violation detection gate part 5 which detects the HDB3 code violation based on these judgement results or outputs.

Figure 3:
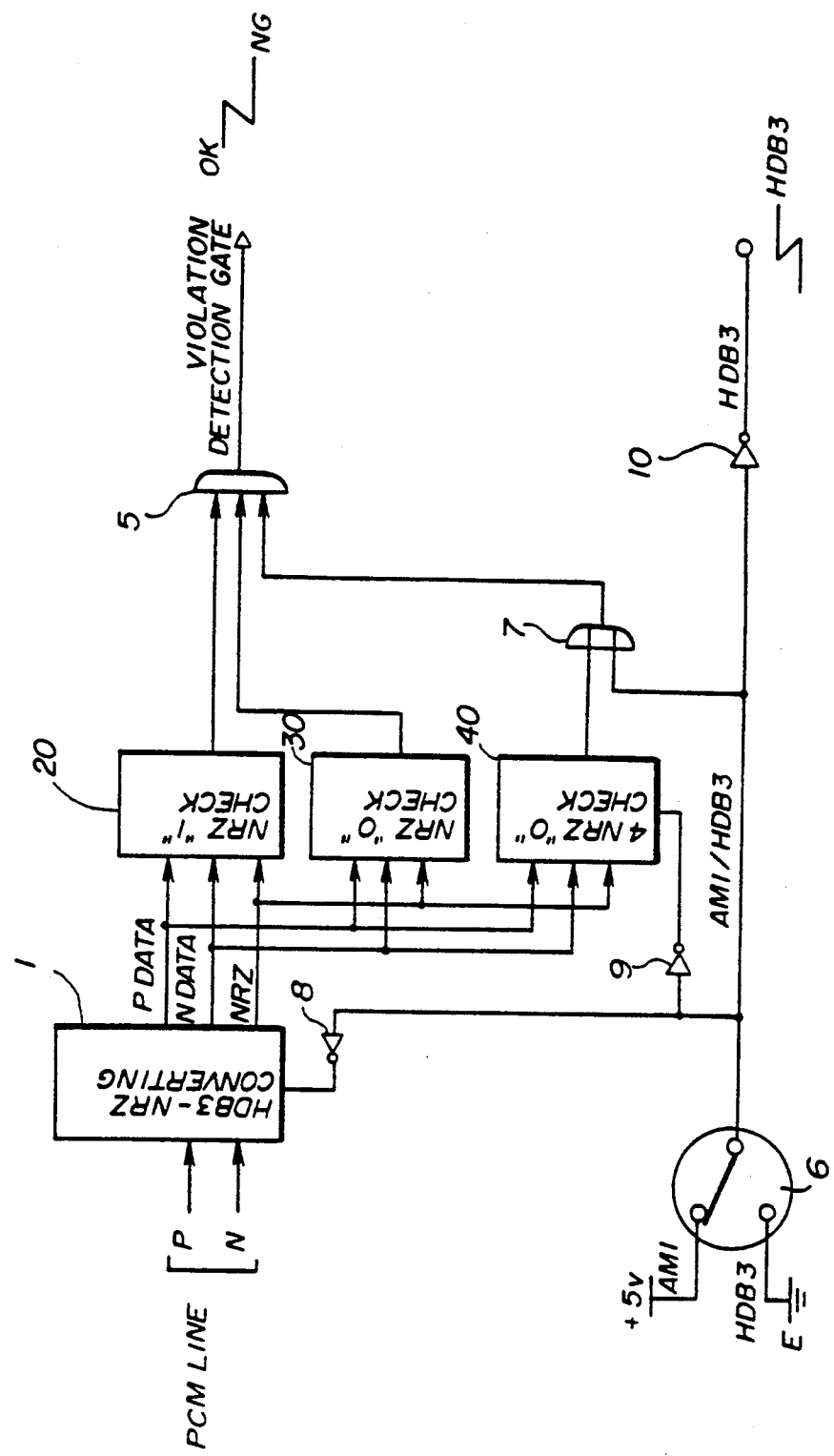
FIG. 3 is a system block diagram showing an embodiment of the HDB3 code violation detector according to the present invention.

Next, a description will be given of an embodiment of the HDB3 code violation detector according to the present invention, by referring to FIG. 3. In FIG. 3, those parts which are the same as those corresponding parts in FIG. 2 are designated by the same reference numerals, and a description thereof will be omitted.

As shown in FIG. 3, the HDB3 code violation detector includes a HDB3-NRZ converting part 1, an NRZ "1"check part 20, an NRZ "0"check part 30, a four consecutive NRZ "0"check part 40, an HDB3 code violation detection gate part 5, an HDB3/AMI switch 6, an OR gate 7, and inverters 8, 9 and 10.

Figure 4:
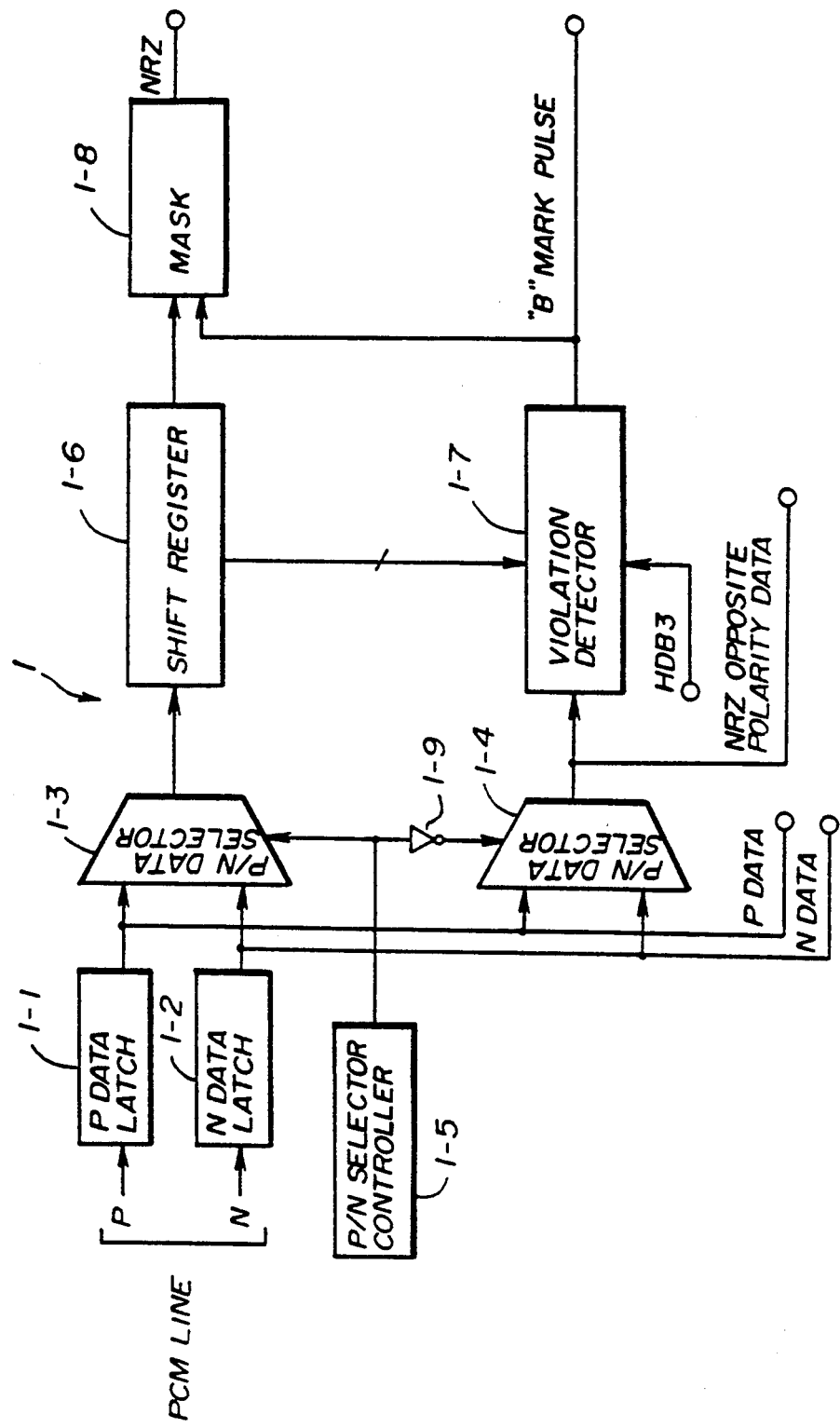
FIG. 4 is a system block diagram showing an embodiment of an HDB3/NRZ converting part.

The HDB3-NRZ converting part 1 receives the positive polarity data (hereinafter simply referred to as P data) and the negative polarity data (hereinafter simply referred to as N data) from the PCM line, and converts the HDB3 code which is transmitted via the PCM line into the NRZ signal. As shown in FIG. 4, the HDB3-NRZ converting part 1 includes a P data latch 1—1, an N data latch 1-2, a first P/N data selector 1-3, a second P/N data selector 1-4, a P/N selector controller 1-5, a shift register 1-6, a violation detector 1-7, and an HDB3. violation pattern mask part 1-8.

The P data latch 1—1 latches the P data. On the other hand, the N data latch 1-2 latches the N data.

The first P/N data selector 1-3 selectively outputs the latched data from the P data latch 1—1 and the latched data from the N data latch 1-2. On the other hand, the second P/N data selector 1-4 selectively outputs the latched data from the P data latch 1—1 and the latched data from the N data latch 1-2 as an NRZ opposite polarity data, that is, with a polarity opposite to that of the data output from the first P/N data selector 1-3. The switching of the first and second P/N data selectors 1-3 and 1-4 is controlled by the P/N selector controller 1-5.

specifically, the P/N selector controller 1-5 carries out a control so that the first P/N data selector 1-3 selectively outputs the N data when the plus mark pulse "+B" is detected, and carries out a control so that the first P/N data selector 1-3 selectively outputs the P data when the minus mark pulse "-B" is detected. Since a control signal which controls the first P/N data selector 1-3 is inverted by an inverter 1-9 before being supplied to the second P/N data selector 1-4, the second P/N data selector 1-4 selectively outputs the NRZ opposite polarity data which has a polarity opposite to that of the data selectively output from the first P/N data selector 1-3.

The shift register 1-6 successively inputs the data output from the first P/N data selector 1-3, and the output of the shift register 1-6 is supplied to the HDB3 violation pattern mask part 1-8.

The violation detector 1-7 receives the NRZ opposite polarity data from the second P/N data selector 1-4, and outputs a "B" mark pulse for masking the "B" mark when the violation "V" is detected. This violation detector 1-7 is activated only when treating or converting the HDB3 code, because no violation "V" exists when treating or converting the AMI code.

The HDB3 violation pattern mask part 1-8 receives the "B" mark pulse which is output from the violation detector 1-7 when the violation "V" is detected, and masks the violation pattern of the HDB3 code from the output of the shift register 1-6. As a result, the masked part is replaced by data "0"when the violation is detected.

Therefore, the NRZ signal is output from the HDB3 violation pattern mask part 1-8.

The HDB3 -NRZ converting part 1 also outputs the P data which is latched by the P data latch 1—1 and the N data which is latched by the N data latch 1-2.

Figure 5:
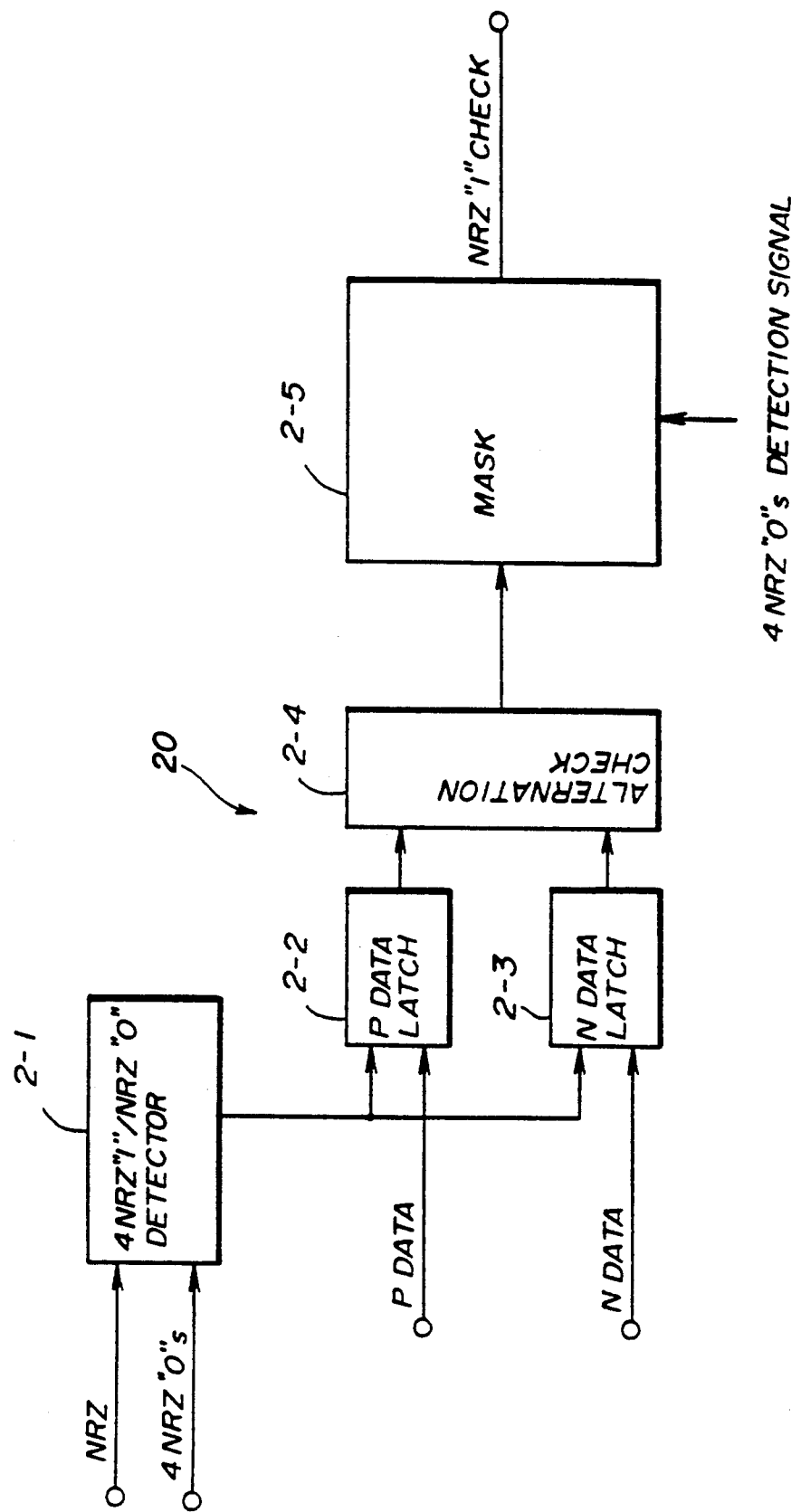
FIG. 5 is a system block diagram showing an embodiment of an NRZ "1"check part.

The NRZ "1"check part 20 in FIG. 3 receives the P data, the N data and the NRZ signal from the HDB3-NRZ converting part 1, and judges whether or not the data pattern is possible when the incoming NRZ signal is NRZ "1". As shown in FIG. 5, the NRZ "1"check part includes a four consecutive NRZ "1"/NRZ "0"detector 2-1, a P data latch 2—2, an N data latch 2-3, an alternation check (alternation judging) part 2-4 and an alternation judgement result mask part 2-5.

As shown in FIG. 8, four data patterns a1 through a4 are possible when the incoming NRZ signal is NRZ "1". In other words, the data patterns a1 and a2 are for checking the alternation of the positive and negative polarities of the present NRZ "1"with respect to the past NRZ "1". The data patterns a3 and a4 are for checking the alternation of the positive and negative polarities of the present NRZ "1"with respect to the violation "V" of the past four consecutive NRZ "0"s.

The four consecutive NRZ "1"/NRZ "0"detector 2-1 detects whether or not four consecutive NRZ "1"s or NRZ "0"s are received. The P data latch 2—2 latches the P data every time the four consecutive NRZ "1"/NRZ "0"detector 2-1 detects four consecutive NRZ "1"s or NRZ "0"s. In addition, the N data latch 2-3 latches the N data every time the four consecutive NRZ "1"/NRZ "0"detector 2-1 detects four consecutive NRZ "1"s or NRZ "0"s.

Based on the latched data from the P data latch 2—2 and the latched data from the N data latch 2—3, the alternation check part 2-4 judges or determines whether or not the polarity alternation of the NRZ "1"s has a predetermined pattern i.e. (the data patterns a1 through a4 shown in FIG. 8).

The alternation judgement result mask part 2-5 masks the judgement result of the alternation check part 2-4 when four consecutive NRZ "0"s of the NRZ signal are detected.

Therefore, the output of the alternation judgement result mask part 2-5 is output as the NRZ "1"judgement result of the NRZ "1"check part 20 in FIG. 3.

When no code violation is made or detected with respect to the NRZ "1", a high-level signal is output from the NRZ "1"check part 20. On the other hand, a low-level signal is output from the NRZ "1"check part 20 when a code violation is made with respect to the NRZ "1".

Figure 6:
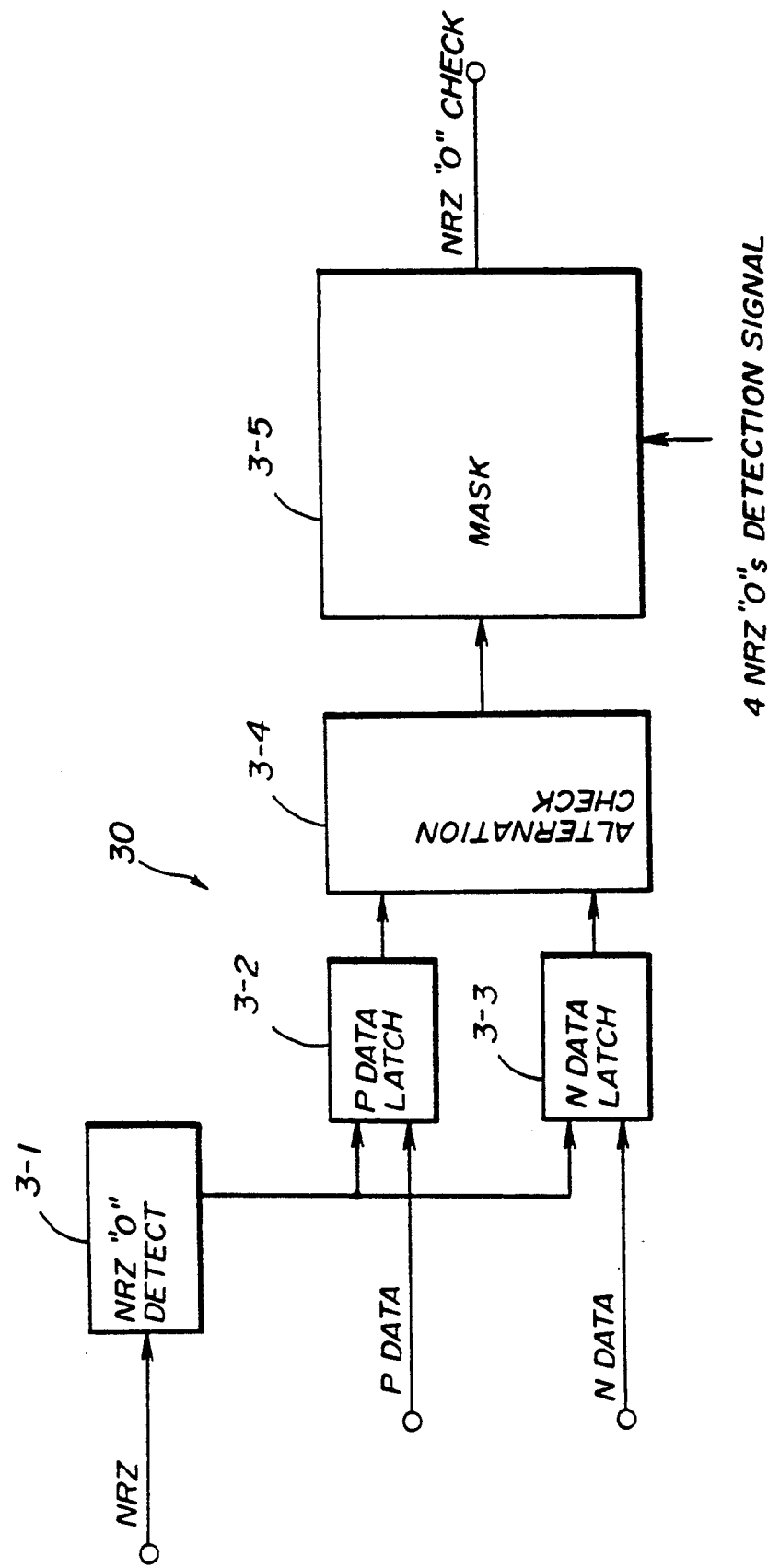
FIG. 6 is a system block diagram showing an embodiment of an NRZ "0"check part.

The NRZ "0"check part 30 of FIG. 3 receives the P data, the N data and the NRZ signal from the HDB3-NRZ converting part 1, and judges whether or not the data pattern is possible when the incoming NRZ signal has a maximum of three consecutive NRZ "0"s. As shown in FIG. 6, the NRZ "0"check part 30 includes an NRZ "0"detector 3-1, a P data latch 3-2, an N data latch 3—3, an alternation check (alternation judging) part 3-4 and an alternation judgement result mask part 3-5.

As shown in FIG. 9, three data patterns b1 through b3 are possible when the incoming NRZ signal has a maximum of three consecutive NRZ "0"s. The data pattern b1 is possible when the incoming NRZ signal has one NRZ "0", the data pattern b2 is possible when the incoming NRZ signal has two consecutive NRZ "0"s, and the data pattern b3 is possible when the incoming NRZ signal has three consecutive NRZ "0"s. In other words, the data patterns b1, b2 and b3 respectively are for checking that the positive and negative polarities of the NRZ "0"are "0"for one NRZ "0", two consecutive NRZ "0"s and three consecutive NRZ "0"s.

The NRZ "0"detector 3-1 detects whether or not the NRZ signal is NRZ "0". The P data latch 3-2 latches the P data every time "0"detector 3-1 detects the NRZ "0". In addition, N data latch 3—3 latches the N data everytime the NRZ "0"detector 3-1 detects the NRZ "0"as well.

Based on the latched data from the P data latch 3-2 and the latched data from the N data latch 3—3, the alternation check part 3-4 judges whether or not the polarity alternation of the NRZ "0"has a predetermined pattern (i.e., the data patterns b1 through b30) shown in FIG. 9).

The alternation judgement result mask part 3-5 masks the judgement result of the alternation check part 3-4 when four consecutive NRZ "0[s of the NRZ signal are detected.

Therefore, the output of the alternation judgement result mask part 3-5 is output as the NRZ "0"judgement result of the NRZ "0"check part 30.

When no code violation is made with respect to the NRZ "0", a high-level signal is output from the NRZ "0"check part 3. On the other hand, a low-level signal is output from the NRZ "0"check part 30 when a code violation is made with respect to the NRZ "0".

Figure 7:
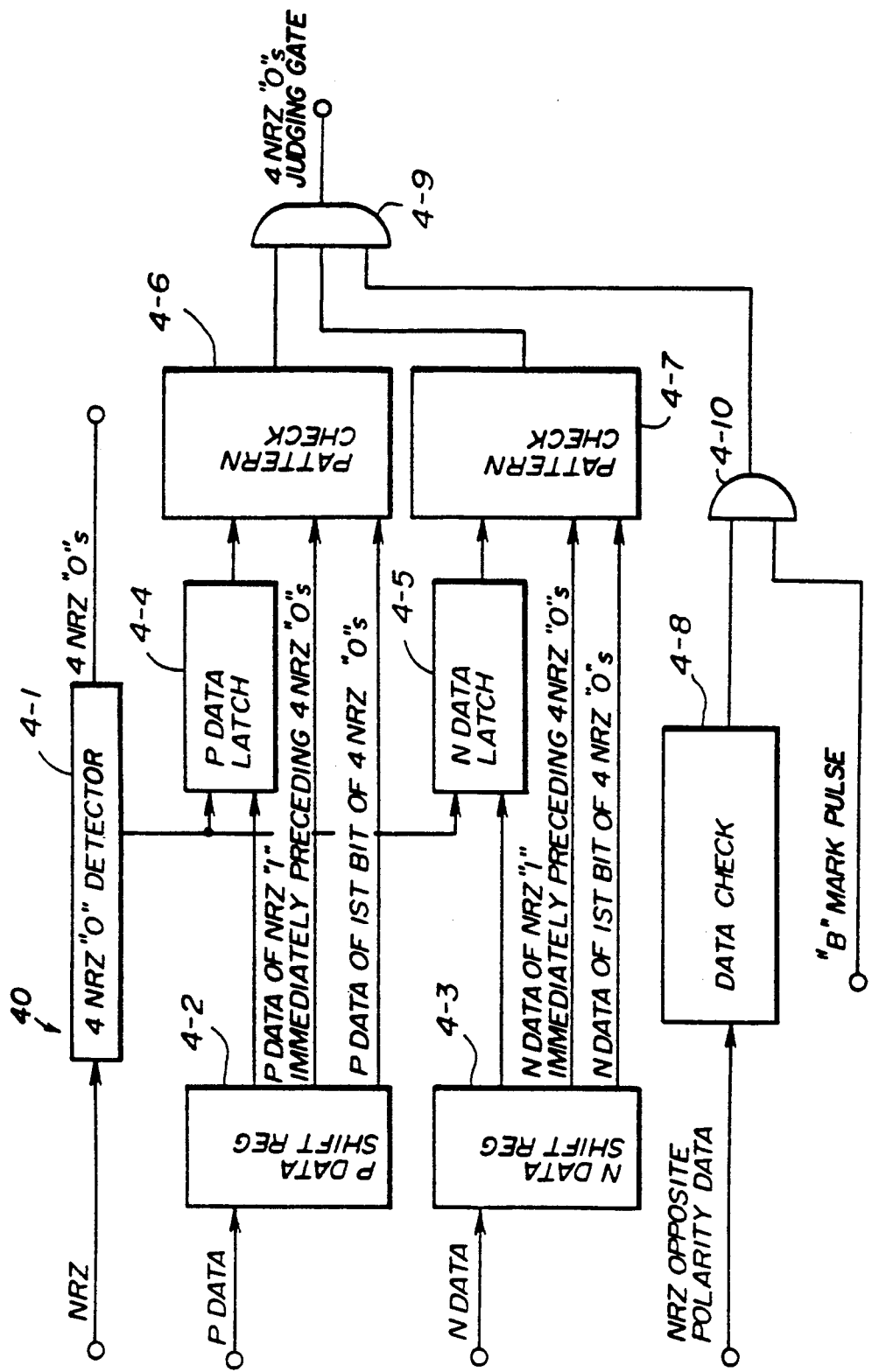
FIG. 7 is a system block diagram showing an embodiment of a consecutive NRZ "0"check part.

The four consecutive NRZ "0"check part 40 in FIG. 3 receives the P data, the N data and the NRZ signal from the HDB3-NRZ converting part 1, and judges whether or not the data pattern is possible when the incoming NRZ signal has at least four consecutive NRZ "0"s. As shown in FIG. 7, the four consecutive NRZ "0"check part 40 includes a four consecutive NRZ "0"detector 4-1, a P data shift register 4-2, an N data shift register 4-3, a P data latch 4—4, an N data latch 4-5, a positive polarity NRZ "0"pattern check (four consecutive positive polarity NRZ "0"judging) part 4-6, a negative polarity NRZ "0"pattern check (four consecutive negative polarity NRZ "0"judging) part 4-7, an NRZ opposite polarity data check (NRZ opposite polarity data judging) part 4-8, a four consecutive NRZ "0"check or judging gate part 4-9, and an AND gate 4-10.

As shown in FIG. 10, six data patterns c1 through c6 are possible when the incoming NRZ signal has at least four consecutive NRZ "0"s. In other words, the data patterns c1 and c2 are used to check that the first bit of the four consecutive NRZ "0"s has "0"positive ornegative polarity. In addition, the data patterns c1 and c2 are used to check that the fourth bit has the same polarity as the immediately preceding mark "B" when the previous violation "V" and the immediately preceding mark "B" have mutually opposite polarities. The data patterns c3 and c4 are used to check that the first bit of the four consecutive NRZ "0"s has the mark "B" with a polarity opposite to that of the immediately preceding mark "B", and to check the violation "V" at the fourth bit has the same polarity as the latter mark "B" when the previous violation "V" and the immediately preceding mark "B" have the same polarity. The data patterns c5 and c6 are used to check that the first bit of the four consecutive NRZ "0"s has the mark "B" with a polarity opposite to that of the previous violation "V", and to check that the violation "V" at the fourth bit has the same polarity as the mark "B" at the first bit when there are four consecutive NRZ "0"s, by assuming that the previous violation "V" and the immediately preceding mark "B" have the same polarity because there is no immediately preceding mark "B" in this case.

Figure 11:
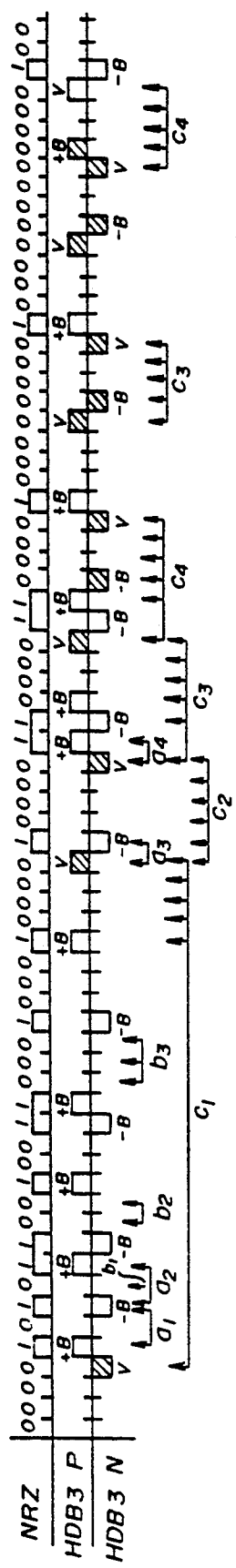
FIG. 11 is a diagram for explaining a check pattern for NRZ "1", NRZ "0" and four consecutive NRZ "0".

In the NRZ signal sequence, the possible data patterns (a1 through a4, b1 through b3, c1 through c6) are shown in FIG. 11 for the cases where there are three or less consecutive NRZ "1"s or "0"s and the cases where there are four or more consecutive NRZ "0"s.

The four consecutive NRZ "0"detector 4-1 in FIG. 7 detects whether or not the NRZ signal has four consecutive NRZ "0"s, and this four consecutive NRZ "0'detector 4-1 is activated only when treating or converting the HDB3 code.

The P data shift register 4-2 is a 12-stage shift register for successively latching or shifting only a predetermined number of P data (for example, twelve P data). Similarly, the N data shift register 4-3 is a 12-stage shift register for successively latching or shifting only a predetermined number of N data (for example, twelve N data).

The P data latch 4—4 is used as a positive polarity violation bit latch and latches the P data (violation bit) from the sixth stage of the P data shift register 4-2, for example, every time the four consecutive NRZ "0"detector 4-1 detects four consecutive NRZ "0"s of the NRZ signal. The N data latch 4-5 is used as a negative polarity violation bit latch and latches the N data (violation bit) from a stage of the N data shift register 4-3, every time the four consecutive NRZ "0"detector 4-1 detects four consecutive NRZ "0"s of the NRZ signal.

The positive polarity NRZ "0"pattern check part 4-6 judges whether or not the predetermined pattern of four consecutive positive polarity NRZ "0"s is obtained based on the latched data from the P data latch 4—4, the P data of the NRZ "1"immediately before the four consecutive NRZ "0"s stored in the P data shift register 4-2 and the P data of the first bit of the four consecutive NRZ "0"s. This predetermined pattern for the positive polarity corresponds to the previous violation "V", the immediately preceding mark "B" and the first bit of the four consecutive positive polarity NRZ "0"shown in FIG. 10.

On the other hand, the negative polarity NRZ "0"pattern check part 4-7 judges whether or not the predetermined pattern of four consecutive negative polarity NRZ "0"s is obtained based on the latched data from the N data latch 4-5, the N data of the NRZ "1"immediately before the four consecutive NRZ "0"s stored in the N data shift register 4-3 and the N data of the first bit of the four consecutive NRZ "0"s. This predetermined pattern for the negative polarity corresponds to the previous violation "V", the immediately preceding mark "B" and the first bit of the four consecutive positive polarity NRZ "0"s as shown in FIG. 10.

The outputs of the pattern check parts 4-6 and 4-7 are supplied to the four consecutive NRZ "0"judging gate part 4-9.

The NRZ opposite polarity data check part 4-8 receives the NRZ opposite polarity data from the HDB3-NRZ converting part 1, and judges or determines whether or not a predetermined pattern is obtained for the NRZ opposite polarity data when four consecutive NRZ "0"s are detected. This predetermined pattern corresponds to the pattern of the second through fourth bits shown in FIG. 10 when four consecutive NRZ "0"occur. The judgement result of the NRZ opposite polarity data check part 4-8 is supplied to the four consecutive NRZ "0"judging gate part 4-9 via the AND gate 4-10 which is controlled by the "B" mark pulse.

The four consecutive NRZ "0"judging gate part 4-9 judges whether or not the incoming NRZ signal has the pattern (the data patterns c1 through c3 shown in FIG. 10) which is possible when four consecutive NRZ "0"s occur, based on a logical product of the judgement results of the positive polarity NRZ "0"pattern check part 4-6, the negative polarity NRZ "0"pattern check 4-8. Hence, a 3-input AND gate is used for the four consecutive NRZ "0"judging gate part 4-9.

Therefore, the output of the four consecutive NRZ "0"judging gate part 4-9 is output as the judgement result of the four consecutive NRZ "0"check part 40.

The judgement result output from the four consecutive NRZ "0"check part 40 is a high-level signal when no code violation is made for the four consecutive NRZ "0"s, and is a low-level signal when a code violation is made for the four consecutive NRZ "0"s.

The HDB3 code violation detection gate part 5 shown in FIG. 3 detects the code violation of the HDB3 code based on a logical product of the judgement results of the NRZ "1"check part 20, the NRZ "0"check part 30 and the four consecutive NRZ "0"check part 40. Hence, a 3-input AND gate is used for the HDB3 code violation detection gate part 5.

The judgement result of the four consecutive NRZ "0"check part 40 is supplied to the HDB3 code violation detection gate part 5 via the OR gate 7.

The HDB3/AMI switch 6 is connected to the ground (low-level) side when treating the HDB3 code, and is connected to the pull-up (high-level, +5V) side when treating the AMI code. The high or low level output signal of the HDB3/AMI switch 6 is supplied to the OR gate 7. The output signal of the HDB3/AMI switch 6 is also supplied to the violation detector in 1-7 in FIG. 4 of the HDB3-NRZ converting part 1, via the inverter 8, and is also supplied to the four consecutive NRZ "0"detector 4-1 in FIG. 7 of the four consecutive NRZ "0"check part 40 via the inverter 9.

Furthermore, the output signal of the HDB3/AMI switch 6 is output via the inverter 10 as the "B" mark mask signal.

This embodiment of the HDB3 code violation detector according to the present invention has the structure described above. First, the HDB3-NRZ converting part 1 receives the P data and the N data from the PCM line, and the HDB3 code which is received via the PCM line is converted into the NRZ signal. In other words, at the HDB3-NRZ converting part 1, the P data latch 1—1 in FIG. 4 latches the P data and the N data latch 1-2 latches the N data, and further, the first P/N data selector 1-3 selectively outputs the latched data from the P data latch 1—1 and the latched data from the N data latch 1-2. Then, the output of the first P/N data selector 1-3 is successively input to the shift register 1-6.

On the other hand, the second P/N data selector 1-4 selectively outputs the latched data from the P data latch 1—1 and the latched data from the N data latch 1-2 as an NRZ opposite polarity data. That is the data from the N data latch 1-2 has a polarity opposite to that of the data output the first P/N data selector 1-3. The violation detector 1-7 receives the NRZ opposite polarity data from the second P/N data selector 1-4. The HDB3 violation pattern mask part 1-8 masks the violation pattern of the HDB3 code from the output of the shift register 1-6 when the violation detector 1-7 detects the violation "V" is detected. As a result, the NRZ signal is output from the HDB3 violation pattern mask part 1-8.

The violation detector 1-7 of the HDB3-NRZ converting part 1 is activated only when treating or converting the HDB3 code. Whether or not the HDB3 code is being treated can be detected from the state (or connection mode) of the HDB3/AMI switch 6 in FIG. 3.

Thereafter, the NRZ signal which is obtained by the conversion in the HDB3 -NRZ converting part 1 is supplied to the NRZ "1"check part 20, the NRZ "0"check part 30 and the four consecutive NRZ "0"check part 40 together with the P data and the N data.

The NRZ "1"check part 20 receives the P data, the N data and the NRZ signal from the HDB3-NRZ converting part 1, and judges whether or not the pattern is possible (that is, one of the data patterns a1 through a4 shown in FIG. 8) when the incoming NRZ signal is NRZ "1". The NRZ "0"check part 30 receives the P data, the N data and the NRZ signal from the HDB3-NRZ converting part 1, and judges whether or not the pattern is possible (that is, one of the data patterns b1 through b3 shown in FIG. 9) when the incoming NRZ signal has a maximum of three consecutive NRZ "0"s. The four consecutive NRZ "0"check part 40 receives the P data, the N data and the NRZ signal from the HDB3-NRZ converting part 1, and judges whether or not the pattern is possible (that is, one of the data patterns c1 through c6 shown in FIG. 10) when the incoming NRZ signal has at least four consecutive NRZ "0"s.

In other words, the four consecutive NRZ "1"/NRZ "0"detector 2-1 in FIG. 5, of the NRZ "1"check part 20 detects whether or not four consecutive NRZ "1"s or NRZ "0"are received. The P data latch 2—2 latches the P data every time the four consecutive NRZ "1"/NRZ "0"detector 2-1 defects four consecutive NRZ "1"s or NRZ "0"s. In addition, the N data latch 2-3 also latches the N data every time the four consecutive NRZ "1"/NRZ "0"detector 2-1 detects four consecutive NRZ "1"s or NRZ "0"s. Thereafter, based on the latched data from the P data latch 2—2 and the latched data from the N data latch 2-3, the alternation check part 2-4 judges whether or not the polarity alternation of the NRZ "1"s has a predetermined pattern. The alternation judgement result mask part 2-5 masks the judgement result of the alternation check part 2-4 when four consecutive NRZ "0"s of the NRZ signal are detected. The output of the alternation judgement result mask part 2-5 is output as the NRZ "1"judgement result of the NRZ "1"check part 20.

The NRZ "0"detector 3-1 of the NRZ "0"check part 30 in FIG. 6 detects whether or not the NRZ signal is NRZ "0". The P data latch 3-2 latches the P data every time the NRZ "0"detector 3-1 detects the NRZ "0". in addition, the N data latch 3—3 latches the N data every time the NRZ "0"detector 3-1 detects the NRZ "0". Based on the latched data from the P data latch 3-2 and the latched data from the N data latch 3—3, the alternation check part 3-4 judges whether or not the polarity alternation of the NRZ "0"s has a predetermined pattern. The alternation judgement result mask part 3-5 masks the judgement result of the alternation check part 3-4 when four consecutive NRZ "0"s of the NRZ signal are detected. The output of the alternation judgement result mask part 3-5 is output as the judgement result of the NRZ "0"check part 30.

The four consecutive NRZ "0"detector 4-1 in FIG. 7 of the four consecutive NRZ "0"check part 40 detects whether or not the NRZ signal has four consecutive NRZ "0"s. The P data shift register 4-2 successively latches only a predetermined number of P data (for example, twelve P data). Similarly, the N data shift register 4-3 successively latches only a predetermined number of N data (for example, twelve N data). The P data latch 4—4 latches the P data from the P data shift register 4-2 every time the four consecutive NRZ "0"detector 4-1 detects four consecutive NRZ "0"s of the NRZ signal. The N data latch 4-5 latches the N data from the N data shift register 4-3 every time the four consecutive NRZ "0"detector 4-1 detects four consecutive NRZ "0"of the NRZ signal.

Thereafter, the positive polarity NRZ "0"pattern check part 4-6 judges whether or not the predetermined pattern of four consecutive positive polarity NRZ "0"s is obtained based on the latched data from the P data latch 4—4, the P data of the NRZ "1" immediately before the four consecutive NRZ "0"s stored in the P data shift register 4-2 and the P data of the first bit of the four consecutive NRZ "0"s. On the other hand, the negative polarity NRZ "0"pattern check part 4-7 judges whether or not the predetermined pattern of four consecutive negative polarity NRZ "0"is obtained based on the latched data from the N data latch 4-5, the N data of the NRZ "1"immediately before the four consecutive NRZ "0"s stored in the N data shift register 4-3 and the N data of the first bit of the four consecutive NRZ "0".

The NRZ opposite polarity data check part 4-8 receives the NRZ opposite polarity data from the HDB3-NRZ converting part 1, and judges whether or not a predetermined pattern is obtained for the NRZ opposite polarity data when four consecutive NRZ "0"s are detected.

The four consecutive NRZ "0"judging gate part 4-9 judges whether or not the incoming NRZ signal has the pattern (the data patterns c1 through c3 shown in FIG. 10 which is possible when, four consecutive NRZ "0"s occur. This determination is based on a logical product of the judgement results of the positive polarity NRZ "0"pattern check part 4-6, the negative polarity NRZ "0"pattern check part 4-7 and the NRZ opposite polarity data check part 4-8. The output of the four consecutive NRZ "0"judging gate part 4-9 is output as the judgement result of the four consecutive NRZ "0"check part 40.

The four consecutive NRZ "0"detector 4-1 of the four consecutive NRZ "0"check part 40 is activated only when treating the HDB3 code. As described above, it is possible to detect from the state of the HDB3/AMI switch 6 whether the HDB3 code or the AMI code is being treated.

The HDB3 code violation detection gate part 5 detects the code violation of the HDB3 code based on the judgement results of the NRZ "1"check part 20, the NRZ "0"check part 30 and the four consecutive NRZ "0"check part 40. A high-level signal is obtained from each of the NRZ"1"check part 20, the NRZ "0"check part 30 and the four consecutive NRZ "0"check part 40 when no code violation is made for the NRZ "1", the NRZ "0"and the four consecutive NRZ "0"s. On the other hand, a low-level signal is obtained from each of the NRZ "1"check part 20, the NRZ "0"check part 30 and the four consecutive NRZ "0"check part 4 when a code violation is made for the NRZ "1", the NRZ "0"and the four consecutive NRZ "0"s. Therefore, the HDB3 code violation detection gate part 5 outputs a high-level signal which indicates that no code violation is made when a high-level signal is obtained from each of the NRZ "1"check part 2, the NRZ "0"check part and the four consecutive NRZ "0"check part 40 when a code violation is made for the NRZ "1", the NRZ "0"and the four consecutive NRZ "0"s, respectively. However, when a low-level signal is obtained from at least one of the NRZ "1"check part 20, the NRZ "0"check part 30 and the four consecutive NRZ "0"check part 40 when a code violation is made for the NRZ "1", the NRZ "0"and the four consecutive NRZ "0"s, respectively the HDB3 violation detection gate part 5 outputs a low-level signal which indicates that a code violation is made.

Therefore, the four problems of the conventional system are all eliminated.

The first problem is eliminated because the alternation check is made for the mark "B".

The second problem is eliminated because, when there are four consecutive NRZ "0"s, it is checked that the violation pattern "B00V" has the same polarity as the immediately preceding "B" mark pulse when the previous violation "V" and the immediately preceding "B" mark pulse have mutually opposite polarities. It is also checked that the violation pattern "000V" has the opposite polarity as the immediately preceding "B" mark when the previous violation "V" and the immediately preceding "B" mark pulse have the same polarity. In addition, the fourth problem is eliminated because opposite polarities of the previous violation "V", the immediately preceding "B" mark pulse, and the violation patterns "B00V" and "000V" are also checked simultaneously.

Furthermore, the third problem is eliminated since a check is made to determine that there is no positive or negative pulse in the case of NRZ "0".

When treating the AMI code, the theory used for the single NRZ "0"and the NRZ "1"when detecting the HDB3 code violation may be similarly applied for the detection of the AMI code violation. Hence, the quality check of the digital line can be made for both the HDB3 code and the AMI code.

When employing the function of detecting the HDB3 code violation and the AMI code violation into a digital transmission system for the purpose of checking the line quality, the scale of the circuit is only increased slightly even when this function is added to the circuit of the existing system. By the addition of this function, however, the accuracy of the code violation detection is improved considerably.

Further, the present invention is not limited to these embodiments, but various variations and modifications may be made without departing from the scope of the present invention.

What is claimed is:

1. An HDB3 code violation detector, comprising:
   converting means for receiving positive polarity data and negative polarity data from a PCM line and for converting an HDB3 code received via the PCM line into an NRZ signal comprising one of an NRZ "1", a maximum of three consecutive NRZ "0"s, and at least four consecutive NRZ "0"s, said NRZ signal having a pattern;
   first judging means, coupled to said converting means and receiving the positive polarity data, the negative polarity data and the NRZ signal, for determining whether the pattern of the NRZ signal received from said converting means exists when the NRZ signal is NRZ "1"and for outputting a first judgement result;
   second judging means, coupled to said converting means and receiving the positive polarity data, the negative polarity data and the NRZ signal, for determining whether the pattern of the NRZ signal received from said converting means exists when the NRZ signal has the maximum of three consecutive NRZ "0"s and for outputting a second judgement;
   third judging means, coupled to said converting means and receiving the positive polarity data, the negative polarity data and the NRZ signal, for determining whether the pattern of the NRZ signal received from said converting means exists when the NRZ signal has the at least four consecutive NRZ "0"s and for outputting a third judgement result; and
   determining means, coupled to said first, second, and third judging means, for detecting a code violation of the HDB3 code based on the first, second and third judgement results of said first, second and third judging means, respectively.

2. The HDB3 code violation detection as claimed in claim 1, wherein said converting means comprises:
   a first data latch, connected to said PCM line latching the positive polarity data forming first latched data;
   a second data latch, connected to said PCM line, latching the negative polarity data forming second latched data;
   a first selector, connected to said first and second data latches, selectively outputting first data, said first data comprising the first latched data from said first data latch and the second latched data from said second data latch;
   a second selector, connected to said first and second data latches, selectively outputting an NRZ opposite polarity data, said NRZ opposite polarity data comprising the first latched data from said first data latch and the second latched data from said second data latch and having a polarity opposite of the first data output from said first selector;
   a shift register, connected to said first selector, successively inputting the first data output from said first selector and outputting a shift output;
   a violation detector, connected to said second selector, detecting a violation based on the NRZ opposite polarity data output from said second selector; and
   mask means, coupled to said shift register and said violation detector, for masking a violation pattern of the HDB3 code from the shift output from said shift register when said violation detector detects the violation.

3. The HDB3 code violation detector as claimed in claim 2, wherein said violation detector of said converting means is activated only when the HDB3 code is to be converted into the NRZ signal.

4. The HDB3 code violation detector as claimed in claim 1, wherein:
   said NRZ signal comprises one of four consecutive NRZ "1"s and four consecutive NRZ "0"s, said four consecutive NRZ "1"s having a polarity alternation forming a predetermined pattern; and
   said first judging means comprises:
      a detector, connected to said converting means, detecting one of the four consecutive NRZ "1"s and the four consecutive NRZ "0"s;
      a first data latch, connected to said detector, latching the positive polarity data each time the detector detects one of the four consecutive NRZ "1"s and the four consecutive NRZ "0"s forming first latched data;
      a second data latch, connected to aid detector, latching the negative polarity data each time the detector detects one of the four consecutive NRZ "1"s and the four consecutive NRZ "0"s forming second latched data;
      judging means, coupled to said first and second data latches, for determining whether the polarity alternation of the four consecutive NRZ "1"s has the predetermined pattern based on the first latched data from said first data latch and the second latched data from said second data latch, and for outputting a judgement result; and
      mask means, coupled to said judging part, for masking the judgement result output from said judging part when the four consecutive NRZ "0"s of the NRZ signal are detected, and for outputting the first judgement result of said first judging means.

5. The HDB3 code violation detector as claimed in claim 1, wherein:
   said NRZ signal comprises one of an NRZ "0"and four consecutive NRZ "0"s, having a polarity alternation forming a predetermined pattern; and
   said second judging means comprises:
      a detector, connected to said converting means, detecting the NRZ "0"of the NRZ signal;
      a first data latch, connected to said detector, latching the positive polarity data each time said detector detects the NRZ "0"of the NRZ signal forming first latched data;
      a second data latch, connected to said detector, latching the negative polarity data each time said detector detects the NRZ "0"of the NRZ signal forming second latched data;
      judging means, coupled to said first and second data latches, for determining whether the polarity alternation of the NRZ "0"has the predetermined pattern based on the first latched data from said first data latch and the second latched data from said second data latch, and for outputting a judgement result; and mask means, coupled to said judging part, for masking the judgement result output from said judging part when the four consecutive NRZ "0"s of the NRZ signal are detected, and for outputting the second judgement result of said second judging means.

6. The HDB3 code violation detector as claimed in claim 1, wherein;
said positive polarity data comprises a first predetermined number;
said negative polarity data comprises a second predetermined number;
said NRZ signal comprises four consecutive NRZ "0"s having a first bit and one of a positive polarity and negative polarity forming a predetermined pattern; and
said third judging means comprises:
a detector, connected to said converting means, detecting the four consecutive NRZ "0"s of the NRZ signal;
a first shift register, connected to said converting means, successively latching the first predetermined number of the positive polarity data;
a second shift register, connected to said converting means, successively latching the second predetermined number of the negative polarity data;
a first data latch, connected to said first shift register and said detector, latching the positive polarity data from said first shift register each time said detector detects the four consecutive "0"s of the NRZ signal forming first latched data;
a second data latch, connected to said second shift register and said detector, latching the negative polarity data from said second shift register each time said detector detects the four consecutive NRZ "0"s of the NRZ signal forming second latched data;
first judging means for judging whether the predetermined pattern of the four consecutive NRZ "0"s having the positive polarity is obtained, based on the first latched data from said first data latch, the positive polarity data of the NRZ "1"immediately preceding the four consecutive NRZ "0"s from said first shift register and the positive polarity data of the first bit of the four consecutive NRZ "0"s;
second judging means for determining whether the predetermined pattern of the four consecutive NRZ "0"s having the negative polarity is obtained, based on the second latched data from said second data latch, the negative polarity data of the NRZ "1"immediately preceding the four consecutive NRZ "0"s from said second shift register and the negative polarity data of the first bit of the four consecutive NRZ "0"s;
third judging means for receiving from the converting means NRZ opposite polarity data having a second predetermined pattern and a polarity opposite of the NRZ signal which is output from said converting means, and for determining whether the NRZ opposite polarity data has the second predetermined pattern when the four consecutive NRZ "0"s are detected; and
gate means for judging whether the NRZ signal has the pattern which is possible when the four consecutive NRZ "0"s are detected, based on the determining in said first, second and third judging parts.

7. The HDB3 code violation detector as claimed in claim 6, wherein said detector of said detecting means is activated only when the HDB3 code is to be converted into the NRZ signal.

8. An HDB3 code violation detector as claimed in claim 1, wherein the HDB3 code comprises an AMI code.

9. An HDB3 code violation detector receiving an NRZ signal from an HDB3-NRZ converter, the NRZ signal comprising a mark pulse, an immediately preceding bit and positive and negative pulses, the detector comprising:
a checking device which checks the mark pulse and the immediately preceding bit, and performs a pattern check and a first alternation check on the positive and negative pulses forming a checked mark pulse; and
checking means for performing a second alternation check on the checked mark pulse generated by aid checking device.

10. An HDB3 code violation detector as claimed in claim 9, wherein;
said positive and negative pulses form a pattern; and
said checking means performs an opposite polarity check on said pattern and said mark pulse.

11. An HDB3 code violator detector as claimed in claim 10, wherein said checking means performs a pulse check to determine whether one of the positive and negative pulses are present.

12. An HDB3 code violation detector as claimed in claim 11, wherein:
said pattern comprises a violation pattern indicating a violation; and
said checking means checks that the violation pattern has a same first polarity as the mark pulse when the violation and the mark pulse are of opposite second polarities, and checks that the violation pattern has an opposite third polarity as the mark pulse when the violation and the mark pulse have a same fourth polarity.

13. An HDB3 code violation detection method, wherein an NRZ signal is received from an HDB3-NRZ converter, the NRZ signal comprising a mark pulse, an immediately preceding bit and positive and negative pulses, the method comprising the steps of:
(a) checking the mark pulse and the immediately preceding bit, and performing a pattern check and a first alternation check on the positive and negative pulses; and
(b) performing a second alternation check on the mark pulse.

14. An HDB3 code violation detection method as claimed in claim 13, wherein said positive and negative pulses form a pattern, the method further comprising the step of (c) performing an opposite polarity check on said pattern and said mark pulse.

15. An HDB3 code violation detection method as claimed in claim 14, further comprising the step of (d) performing a pulse check to determine whether one of the positive and negative pusles are present.

16. An HDB3code violation detection method as claimed in claim 15, wherein said pattern comprises a violation pattern indicating a violation, the method further comprising the steps of:
(e) checking that the violation pattern has a same first polarity as the mark pulse when the violation and the mark pulse are of opposite second polarities; and
(f) checking that the violation pattern has an opposite third polarity as the mark pulse when the violation and the mark pulse have a same fourth polarity.

* * * * *

UNITED STATES PATENT AND TRADEMARK OFFICE
CERTIFICATE OF CORRECTION

PATENT NO. : 5,285,459
DATED : February 8, 1994
INVENTOR(S) : Okuyama et al.

It is certified that error appears in the above-indentified patent and that said Letters Patent is hereby corrected as shown below:

Col. 1, line 18, delete ";";
line 29, change "as" to --of--;
line 48, change "alteration" to --alternation--.

Col. 2, line 7, delete ",";
line 27, after "provided" insert --,--;
line 53, delete ",";
line 66, after "a" insert --four--.

Column 3, line 34, after ""0"" insert --s--;
line 59, after "is" delete space;
line 61, change "a" to --an--;
line 67, delete "con";
line 68, change "necting" to --converting--.

Column 4, line 53, delete "a";
line 58, after "four" insert --consecutive negative polarity NRZ "0" judging part in the 4 NRZ "0" judging part 4--;
line 68, delete ",".

Column 5, line 42, after "HDB3" delete --.--;
line 56, change "specifically" to --Specifically--.

UNITED STATES PATENT AND TRADEMARK OFFICE
CERTIFICATE OF CORRECTION

PATENT NO. : 5,285,459          Page 2 of 3
DATED : February 8, 1994
INVENTOR(S) : Okuyama et al.

It is certified that error appears in the above-indentified patent and that said Letters Patent is hereby corrected as shown below:

Column 6, line 30, after "part" insert --20--.
Column 7, line 35, change "b30" to --b3--;
         line 39, change " "0[s " to read --"0"s--.

line 46, delete "3" and substitute --30--.
Column 8, lines 2 and 3, delete "ornegative" and substitute --or negative--;
         line 11, after "check" insert --that--;
         line 31, after second "0" delete "'" and substitute --"--.
Column 9, line 18, after "0" insert --s--;
         line 42, delete "." at beginning of line;
         line 52, after "high-level," insert --3--;
         line 57, after "1" delete --,--.
Col. 11, ine 7, delete "in" and substitute --In--;
         line 60, after "10" insert --)--.
Col. 12, line 18, delete "4" and substitute --40--;
         line 22, delete "2" and substitute --20--;
         after "part" insert --30--;
         line 48, after "mark" insert --pulse--.
Col. 13, line 40, delete "determining" and substitute --detecting--;

UNITED STATES PATENT AND TRADEMARK OFFICE
CERTIFICATE OF CORRECTION

PATENT NO. : 5,285,459  
DATED : February 8, 1994  
INVENTOR(S) : Okuyama et al.

It is certified that error appears in the above-indentified patent and that said Letters Patent is hereby corrected as shown below:

line 45, delete "detection" and substitute --detector--;

line 47, after "line" insert --,--.

Col. 14, line 49, after ""0"s," insert --said NR2 "0"--.

Col. 15, line 9, after "wherein" delete "," and substitute --:--.

Col. 16, line 18, delete "aid" and substitute --said--.

Signed and Sealed this

Twentieth Day of September, 1994

Attest:

BRUCE LEHMAN

Attesting Officer      Commissioner of Patents and Trademarks